United States Patent [19]
Kennedy

[11] 3,973,996
[45] Aug. 10, 1976

[54] DIFFUSION WELDED SOLAR CELL ARRAY

[75] Inventor: Paul B. Kennedy, Bellevue, Wash.

[73] Assignee: The Boeing Company, Seattle, Wash.

[22] Filed: Mar. 4, 1974

[21] Appl. No.: 448,103

[52] U.S. Cl. ............................ 136/206; 29/572; 29/573; 29/589; 136/89; 136/201
[51] Int. Cl.² ........................................ H01L 35/02
[58] Field of Search ............... 29/572, 573, 589; 136/206, 201, 89

[56] References Cited
UNITED STATES PATENTS

| | | | |
|---|---|---|---|
| 3,527,619 | 9/1970 | Miley | 136/89 |
| 3,780,424 | 12/1973 | Forestieri | 136/89 X |
| 3,793,082 | 2/1974 | Roger | 29/572 X |

Primary Examiner—Maynard R. Wilbur
Assistant Examiner—Richard E. Berger
Attorney, Agent, or Firm—Donald A. Streck

[57] ABSTRACT

A method of mounting and interconnecting solar cells to form a solar cell array particularly suited to space applications. In the present invention, the solar cells, which are already silver plated on the underside, are diffusion welded to a suitably plated polymide film substrate. The attachment area and current conductor patterns are provided in the plating on the substrate and electrical connection of the solar cells is accomplished by soldering or diffusion welding directly to the plated pattern on the substrate.

5 Claims, 4 Drawing Figures

DIFFUSION WELDED SOLAR CELL ARRAY

BACKGROUND OF THE INVENTION

1. Field of the Invention

Relates to diffusion welding techniques and more particularly to diffusion welding plated non-metallic substrates for solar cell fabrication for space applications.

2. Description of the Prior Art

A common method of attaching thin glass solar cells to a substrate utilizes a silicone elastomer adhesive as shown in FIG. 1. The adhesive method adds weight, cannot withstand the cell annealing temperature (approximately 800°F), tends to outgas in space, and tends to permit undesirable voids between the cell and the substrate. In addition, the interconnecting of the cells to form an array is a source of failure in that one end of each interconnector is under the bottom of the solar cell adjacent to the adhesive. This junction is hidden from inspection and servicing as well as being subjected to the forces of the adhesive.

Therefore, it is an objective of the present invention to provide a method for attaching solar cells to a substrate which is light weight, can withstand the cell annealing temperature, will not outgas in space, and prohibits undesirable voids between the cell and the substrate.

It is another objective of the present invention to provide a method for attaching solar cells to a substrate which will allow for a positive method of cell interconnection to form arrays.

DESCRIPTION OF THE INVENTION

Figure 1:
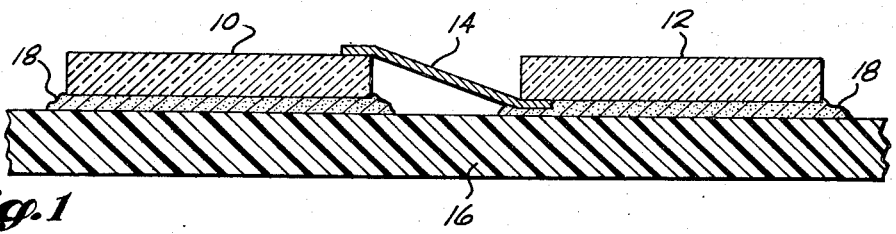
FIG. 1 depicts two solar cells interconnected and attached to a substrate using prior art techniques.

Referring momentarily to FIG. 1, a first solar cell 10 and a second solar cell 12 are shown connected by connector 14 to form an array according to prior art technique. The cells 10 and 12 are attached to substrate 16 with adhesive 18. Substrate 16 is rigid and heavy to prevent separation at the adhesive bond.

Figure 2:
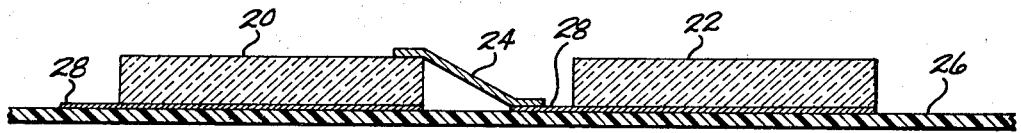
FIG. 2 depicts two solar cells interconnected and attached to a substrate using the present invention.

Referring now to FIG. 2, a first solar cell 20 and a second solar cell 22 are shown connected by connector 24 to form an array according to the preferred embodiment of the present invention. In the preferred embodiment as shown, the substrate 26 is a polyimide film such as DuPont Kapton (or other non-metallics with equivalent or better dielectric, heat resistant, and space environment resistant properties). The attachment areas and current conductor patterns 28 are provided by gold or silver plating on etched copper circuit prepared on the substrate 26 by conventional printed circuit techniques. The polyimide film may be plated by a number of means including sputtering, electroless, electro, and vacuum. Plated films on the order of 5,000 A – 10,000 A or more are satisfactory.

When the attachment areas and current conductor patterns 28 have been formed on the substrate 26, the cells 20 and 22 are diffusion welded to the attachment areas 28. To diffusion weld silver-to-silver plates, temperatures, pressures and times on the order of 500°F, 1000 psi and 5 minutes are satisfactory. Although silver is a convenient plating material for both the substrate and solar cells, other metals may be used for one or both. Gold also diffusion welds readily in air at 550°F, 1500 psi and 15 minutes. When the cells 20 and 22 have been welded to the substrate 26, the cells 20 and 22 can be connected as shown with connector 24 by soldering directly to the plated pattern current conductor 28. As an alternate method, connector 24 can be diffusion welded to the conductor 28 during the welding of the cells 20 and 22 to the substrate 26 or subsequently.

Figure 3:
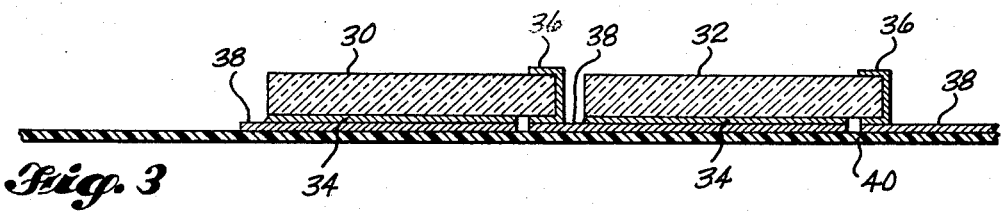
FIG. 3 depicts two solar cells with integral wrap-around connections attached to a substrate using the present invention.

Referring to FIG. 3, solar cells 30 and 32 with integral wrap-around connections 34 and 36 plated on the cells are diffusion welded to the printed circuit array 38 on the substrate 40. In this embodiment the separate connector 24 of FIG. 2 is eliminated.

Figure 4:
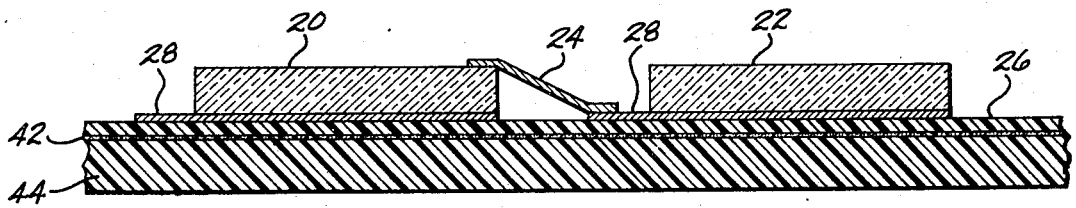
FIG. 4 depicts the solar cell array of FIG. 2 additionally supported with a structure attached to the array using the technique of the present invention.

The embodiments of FIG. 2 and FIG. 3 have an additional advantage for space application of being flexible because of the light flexible substrate 26 and 40. This provides the possibility of rolling such an array into a small package for stowage aboard spacecraft.

Where additional support is desired or required, the same technique can be used to fabricate the alternate embodiment of FIG. 4. In addition to the identical elements of FIG. 2, substrate 26 is additionally plated or coated with adhesive bonding layer 42 on the side opposite cells 20 and 22. Support structure 44 is then adhesive bonded or diffusion welded to substrate 26 as shown. The bonding or welding of support structure 44 can take place anytime during the fabrication operation.

Having thus described my invention, what is claimed is:

1. A solar cell array comprising:
   a. a substrate, said substrate being a non-metallic dielectric;
   b. two solar cells diffusion welded to said substrate; and,
   c. means for electrically interconnecting said two solar cells operably attached to each of said two solar cells.

2. A solar cell array as claimed in claim 1 wherein:
   a. said substrate is plated on one surface, said plating comprising a plurality of non-connected individual mounting and connecting areas,
   b. said two solar cells are plated on one surface of each of said two solar cells; and,
   c. said diffusion welding of said two solar cells to said substrate is accomplished by diffusion welding said plated surface of said two solar cells to individual mounting and connecting areas of said plating on said substrate.

3. A solar cell as claimed in claim 1 wherein said substrate is a polyimide film.

4. A solar cell as claimed in claim 1 wherein said substrate is flexible.

5. The method of forming a solar cell array comprising the steps of:
   a. plating one surface of a first solar cell with a diffusion weldable metallic layer;
   b. plating one surface of a second solar cell with a diffusion weldable metallic layer;

c. plating one surface of a non-metallic, dielectric substrate with a diffusion weldable metallic layer, said metallic layer comprising a plurality of non-connected individual mounting and connecting areas,
d. diffusion welding said plated surface of said first solar cell to one of said individual mounting and connecting areas of said plated surface of said substrate;
e. diffusion welding said plated surface of said second solar cell to another of said individual mounting and connecting areas of said plated surface of said substrate; and
f. operably attaching electrical connecting means from the non-plated surface of said first solar cell to said individual mounting and connecting area of said plated surface of said substrate having said second solar cell diffusion welded thereon.

* * * * *